United States Patent
Iijima

(10) Patent No.: US 7,667,257 B2
(45) Date of Patent: Feb. 23, 2010

(54) CAPACITOR AND PROCESS FOR MANUFACTURING THE SAME

(75) Inventor: Shinpei Iijima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 469 days.

(21) Appl. No.: 11/585,203

(22) Filed: Oct. 24, 2006

(65) Prior Publication Data

US 2007/0108493 A1 May 17, 2007

(30) Foreign Application Priority Data

Nov. 15, 2005 (JP) .............................. 2005-329606

(51) Int. Cl.
*H01L 27/108* (2006.01)

(52) U.S. Cl. .............................. 257/309; 257/E27.089; 438/398

(58) Field of Classification Search .................. 257/308, 257/309, E27.089, E21.019; 438/398, 399
See application file for complete search history.

(56) References Cited

U.S. PATENT DOCUMENTS

2004/0227175 A1* 11/2004 Iijima et al. .................. 257/309
2004/0248362 A1* 12/2004 Nakamura et al. ........... 438/241
2006/0234510 A1* 10/2006 Iijima ......................... 438/695

FOREIGN PATENT DOCUMENTS

JP        10-173148        6/1998

* cited by examiner

Primary Examiner—Thomas L Dickey
Assistant Examiner—Fazli Erdem
(74) Attorney, Agent, or Firm—Young & Thompson

(57) ABSTRACT

Method for solving the problem caused when forming a crown-structure capacitor in a trench which is formed in an insulating film, and having difficulty in electrical by connecting a first upper electrode formed on the inside wall of the trench and a second upper electrode which is to be a plate because of the intervention of dielectric between the first and second upper electrodes. The conducting state of the first upper electrode and the plate upper electrode is ensured by utilizing a tantalum oxide film formed on a titanium nitride film, which is brought to a completely conducting state when heat treated. A crown structure is formed without removing the insulating film, in which a trench has been formed, by wet etching, whereby a stacked trench capacitor, which has double the capacity is provided while eliminating the collapse of the lower electrode or pair bit defect.

11 Claims, 16 Drawing Sheets

CAPACITOR AND PROCESS FOR MANUFACTURING THE SAME

BACKGROUND OF THE INVENTION

1. Field of the Invention

The present invention relates to a capacitor that constitutes DRAM and a process for manufacturing the same, in particular, to a capacitor structure suitable for eliminating the problem of the collapse of the lower electrode, which is caused when forming a lower electrode having a crown shape, and a process for manufacturing the same.

2. Description of the Prior Art

In recent years the capacity of semiconductor devices has been increased more and more. Particularly in DRAMs (DRAM: dynamic random access memory), gigabit-class memories with a minimum feature size of 100 nm are being commercialized, and moreover, development of DRAMs with a minimum feature size of 90 nm or smaller are being proceeded with. With such miniaturization of semiconductor devices, it has become difficult to ensure desired capacity of capacitors, which are principal constituents of DRAMs.

To overcome this difficulty, a capacitor having a crown structure has been examined, in which a trench (deep hole) is formed in an insulating film, both the inside and outside walls of a lower electrode formed on the inside face of the trench are exposed, and the both sides thereof are used as a capacitor. In the capacitor having a crown structure, it is possible to ensure capacitor area about two times larger than that of a capacitor in which only the inside face of the trench is used. Accordingly, the capacitor having a crown structure offers the advantage that it has capacity two times higher than that of a capacitor in which a lower electrode is provided only on the inside face of the trench.

However, conventional processes for preparing a crown-structure capacitor present the problems described below. FIGS. 1A to 1C schematically show the manufacturing process of a crown-structure capacitor. First, as shown in FIG. 1A, a silicon plug 103 is formed in a specified region of a first inter layer dielectric 101, and a silicon nitride film 102 and a second inter layer dielectric 104 consisting of a thick silicon oxide film are deposited. Then, as shown in FIG. 1B, a trench 105 is formed by lithography and dry etching to expose the surface of the silicon plug 103 and then a lower electrode 106 is formed on the inside face of trench. After that, as shown in FIG. 1C, the second inter layer dielectric 104 which supports and surrounds the outside walls of the lower electrode 106 is removed using a hydrofluoric acid (HF) solution. Once the thick silicon oxide film is removed using the HF solution, the lower electrode 106 loses its support and its mechanical strength significantly decreases. As a result, the lower electrode 106 collapses due to the surface tension of the HF solution, causing a pair bit defect, because the adjacent lower electrodes are brought into contact with each other. If the silicon oxide film can be removed by dry etching, which causes no surface tension, the collapse of the lower electrode 106 is effectively prevented. However, in the present state, no practical technique has been realized yet which makes it possible to remove only the silicon oxide film without damaging the shape of the lower electrode.

Under these conditions, a crown-structure capacitor is thought of in which the capacitance is increased without removing the second inter layer dielectric. This technique is described in Japanese Patent Application Laid-Open No. 10-173148. FIGS. 2A to 2G show the manufacturing process of a crown-structure capacitor which is described in Example of the above described patent specification. In the following, the manufacturing process of the crown-structure capacitor described in the patent specification will be explained with reference to FIGS. 2A to 2G.

First, as shown in FIG. 2A, a silicon plug 103 is formed in a specified region of a first inter layer dielectric 101, a silicon nitride film 102 and a second inter layer dielectric 104 consisting of a thick silicon oxide film are deposited. A trench 105 is formed so that the surface of the silicon plug 103 is exposed, and after that a first upper electrode 107 made of polycrystalline silicon is formed on the side wall of the trench 105.

Then, as shown in FIG. 2B, a first dielectric 108 consisting of stacked film made of tantalum oxide and silicon oxide is deposited on the whole surface and then a outside lower electrode 109 made of titanium nitride is deposited and stacked on the whole surface. After that, the outside lower electrode 109 and the first dielectric 108, which are formed on the surface other than the surface of the trench and on the trench bottom, are removed using anisotropic dry etching.

Then, as shown in FIG. 2C, an inside lower electrode 110 made of polycrystalline silicon is deposited and the inside of the trench is filled with a photoresist 111. The photoresist 111 is formed so that its top surface is positioned a little lower than the top of the trench.

Then, as shown in FIG. 2D, the inside lower electrode 110 made of polycrystalline silicon and the outside lower electrode 109 made of titanium nitride are subjected to dry etching so that each top surface is almost at the same level as the top surface of the photoresist 111.

Then, as shown in FIG. 2E, the photoresist 111 is removed, a second dielectric 112 consisting of a stacked film made of tantalum oxide and silicon oxide is deposited, and a second upper electrode 113 made of titanium nitride is deposited on the whole surface so that the trench is filled up with the electrode, followed by etching back so that the top surface of the second upper electrode 113 is at the level shown in the figure.

Then, as shown in FIG. 2F, the exposed portion of the second dielectric 112 is subjected to dry etching so that the top surface of the second dielectric 112 is almost at the same level as the top surface of the second upper electrode 113. At this time, the first dielectric 108 undergoes etching simultaneously, whereby the top of the first upper electrode 107 is exposed.

Then, as shown in FIG. 2G, a third upper electrode 114 made of titanium nitride is deposited on the whole surface so that the first upper electrode 107 and the second upper electrode 113 are connected with each other. The lower electrode connected with the silicon plug 103 is constructed by the inside lower electrode 110 made of polycrystalline silicon and the outside lower electrode 109 made of titanium nitride. Further, the first dielectric 108 consisting of a stacked film made of tantalum oxide and silicon oxide is provided between the first upper electrode 107 and the outside lower electrode 109, and the second dielectric 112 consisting of a stacked film made of tantalum oxide and silicon oxide is provided between the second upper electrode 113 and the inside lower electrode 110, whereby a capacitor having a crown structure is made up in the inside of the trench.

This known example offers the advantage of being capable of preventing the collapse of its lower electrode, because the insulating film constituting the trench is not removed.

However, by the manufacturing process of the crown-structure capacitor described in Japanese Patent Application Laid-Open No. 10-173148, it is very difficult to connect the first upper electrode 107, which is formed on the inside wall of the trench, with the third upper electrode 114. This presents the problem of being unable to make up a crown structure.

In the following, the problem will be described with reference to FIGS. 3A to 3D.

FIG. 3A shows the state after the photoresist 111, which is filled into the inside of the trench after deposition of the inside lower electrode 110 made of polycrystalline silicon in the step shown in FIG. 2C, has been removed by etching back employing dry etching. Etching back is intended to selectively etch the outside lower electrode 109 made of titanium nitride and the inside lower electrode 110 made of polycrystalline silicon so that their top surfaces are made lower as shown in FIG. 2D. However, in actuality, the first upper electrode 107 is unintentionally etched together and its top surface is also made lower. Naturally, the etching progresses on both the first upper electrode 107 and the inside lower electrode 110 since the first upper electrode 107 is made of polycrystalline silicon just like the inside lower electrode 110. As a result, the first dielectric 108 projects from the top surface, forming a vacant space 115 over the first upper electrode 107.

Then, as shown in FIG. 3B, when the second dielectric 112 is deposited, the vacant space 115 is filled with the second dielectric 112, resulting in the formation of an insulating film on the top surface of the first upper electrode 107. The inside upper electrode 113 is formed in this state.

Then, as shown in FIG. 3C, even if the second dielectric 112 is subjected to etch back, the second dielectric 116, which is the second dielectric 112 remaining in the vacant space 115, is formed on the first upper electrode 107, whereby the top surface of the first upper electrode 107 is not exposed.

Even if the third upper electrode 114 is formed in the above state, as shown in FIG. 3D, the connection between the third upper electrode 114 and the first upper electrode 107 can not be ensured because the top surface of the first upper electrode 107 is covered with the second dielectric 116, whereby a crown-structure capacitor can not be realized.

As described so far, when intending to form a crown-structure capacitor in the inside of a trench, the biggest technical problem is to ensure the connection between the third upper electrode 114 and the first upper electrode 107.

In the light of the problem described above, the object of the present invention is to provide a capacitor having a crown structure which aims at electrical connection between upper electrodes by easier and simpler method utilizing an insulating property of tantalum oxide and a process for manufacturing the same.

SUMMARY OF THE INVENTION

After various experiments and examinations, the present inventor has found that a tantalum oxide film is brought to the conducting state when it is formed on a titanium or titanium nitride film. Based on this finding, the inventor hit on a crown-structure capacitor formed in an inside of a trench in which a first upper electrode and a second upper electrode are electrically connected via the tantalum oxide film in the conducting state, and has finally accomplished the present invention.

A capacitor of the present invention is that which comprises at least a lower electrode, a dielectric and an upper electrode:

wherein the upper electrode comprises a first upper electrode and a second upper electrode;

the first upper electrode has a portion where the first upper electrode is opposite to the second upper electrode via the dielectric; and the first upper electrode and the second upper electrode are electrically connected with each other via the dielectric which is in the conducting state at the portion where the first upper electrode is opposite to the second upper electrode.

The capacitor of the present invention is that which is formed in the inside of a trench formed in an insulating film and comprises the lower electrode, the dielectric and the upper electrode:

wherein the lower electrode has a crown structure having an outside face and an inside face;

the upper electrode comprises the first upper electrode which is opposite to the outside face of the lower electrode, and the dielectric and the second upper electrode which extend from the inside face of the lower electrode to the surface other than the surface of the trench; and the first upper electrode and the second upper electrode are electrically connected with each other via the dielectric which is in the conducting state at the portion where the first upper electrode is opposite to the second upper electrode.

The capacitor of the present invention is that wherein on the outside face of the lower electrode, a first capacitor region is provided which comprises a first dielectric formed in contact with the outside face of the lower electrode and a first upper electrode formed on the side face of the trench opposite to the lower electrode, on the inside face of the lower electrode, a second capacitor region is provided which comprises a second dielectric formed in contact with the inside face of the lower electrode and a second upper electrode formed in contact with the second dielectric, the second dielectric and the second upper electrode extend on the surface other than the surface of the trench, and the first upper electrode and the second upper electrode are electrically connected with each other via the second dielectric which is in the conducting state at the portion the first upper electrode is opposite to the second upper electrode. The capacitor of the present invention is that wherein the second dielectric is made of tantalum oxide.

The capacitor of the present invention is that wherein the first upper electrode is made of titanium or titanium nitride and the dielectric is made of tantalum oxide.

The capacitor of the present invention is that wherein the lower electrode is made of at least one material selected from the group consisting of polycrystalline silicon, metal silicide, tungsten and the compounds thereof, and ruthenium.

A process for manufacturing a capacitor of the present invention is that which comprises a conductive plug connected to the surface of a semiconductor substrate and a lower electrode which is connected to the conductive plug, comprising at least:

(1) a step of forming a trench in a specified position of an insulating film which is formed on the whole surface of the conductive plug and exposing the surface of the conductive plug;

(2) a step of forming a first upper electrode on the side wall of the trench;

(3) a step of forming a first dielectric on the side wall of the trench on which the first upper electrode has been formed;

(4) a step of forming a lower electrode on the inside face of the trench on which the first dielectric has been formed and connecting the lower electrode with the conductive plug;

(5) a step of forming a second dielectric so that it extends on the whole surface including the inside face of the trench on which the lower electrode has been formed; and (6) a step of forming a second upper electrode on the whole surface.

The process for manufacturing the capacitor of the present invention is that wherein the first upper electrode is electrically connected with the second upper electrode via the second dielectric which is in the conducting state at the portion where the second dielectric is in contact with the upper end of the first upper electrode.

The process for manufacturing the capacitor of the present invention is that wherein the first upper electrode is made of titanium or titanium nitride, the first dielectric comprises at least aluminum oxide formed by atomic layer deposition, and the second dielectric is made of tantalum oxide.

The process for manufacturing a capacitor of the present invention is that further comprising a step of heat treating in the temperature range of 600° C. to 750° C., after the formation of the second dielectric made of tantalum oxide.

In the crown-structure capacitor of the present invention having been constructed as above, the first upper electrode is constructed by the titanium or titanium nitride film, the second dielectric is constructed by the tantalum oxide film so that it extends on the first upper electrode, whereby the tantalum oxide film in contact with the upper end of the first upper electrode is in the conducting state. Thus, even if the second upper electrode is formed on the tantalum oxide film, the first upper electrode can be electrically connected with the second upper electrode via the tantalum oxide film in the conducting state.

Further, according to the process for manufacturing the capacitor of the present invention, the insulating film that constitutes a trench is not removed, whereby the capacity increasing effect, which is characteristic of a crown-structure capacitor, can be obtained while eliminating the problem of the lower electrode collapse and simplifying the manufacturing steps.

DETAILED DESCRIPTION OF PREFERRED EMBODIMENTS

In the following, Examples of the present invention will be explained in detail with reference to the drawings. First, the insulating property of tantalum oxide will be explained in Example 1. The structure of a DRAM including the capacitor of the present invention will be explained in Example 2, and the process for manufacturing the capacitor of the present invention will be explained in Example 3.

EXAMPLE 1

In this Example 1, the evaluation results of the insulating property of tantalum oxide will be explained with reference to FIGS. 4A and 4B and FIG. 5.

Figure 1A:
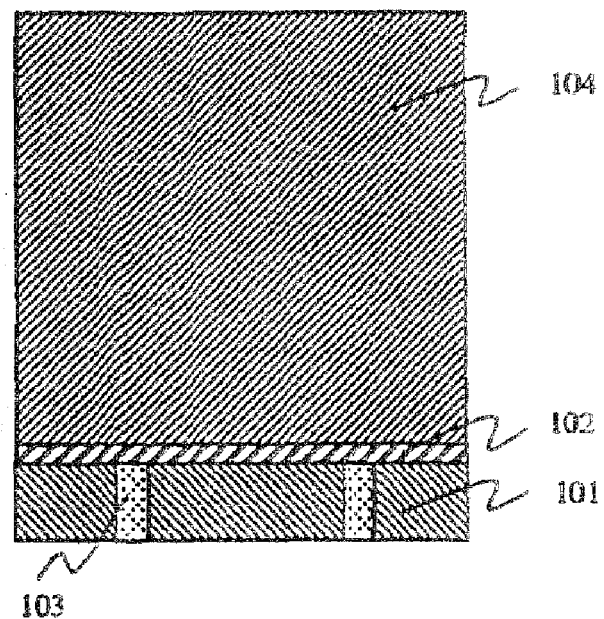
FIGS. 1A to 1C are cross-sectional views of a series of steps to explain a problem caused when forming a crown structure by conventional process.
Figure 1B:
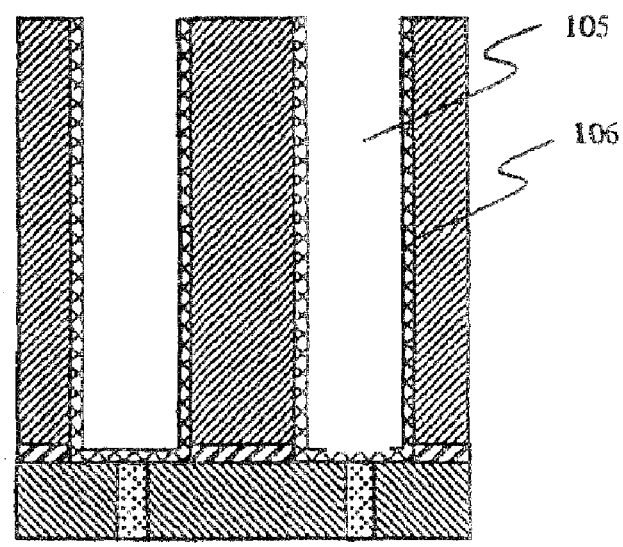
Figure 1C:
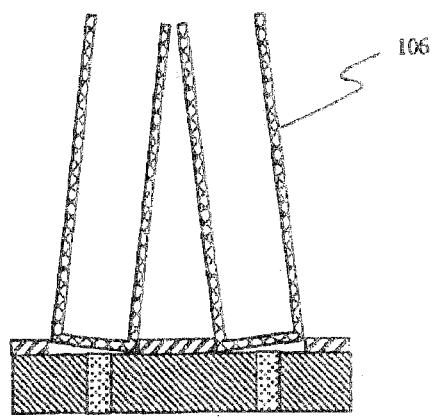
Figure 2A:
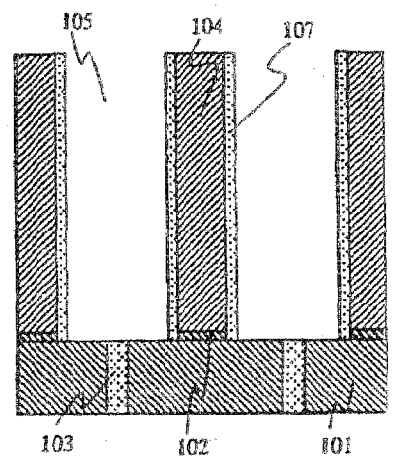
FIGS. 2A to 2G are cross-sectional views of a series of steps to explain Example described in Japanese Patent Application Laid-Open No. 10-173148.
Figure 2B:
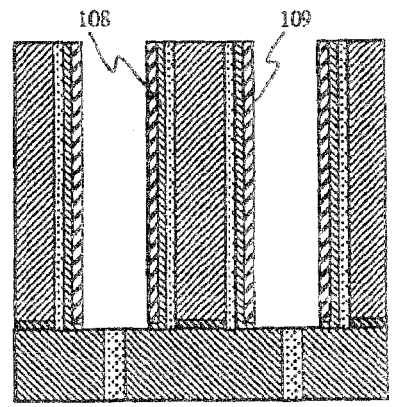
Figure 2C:
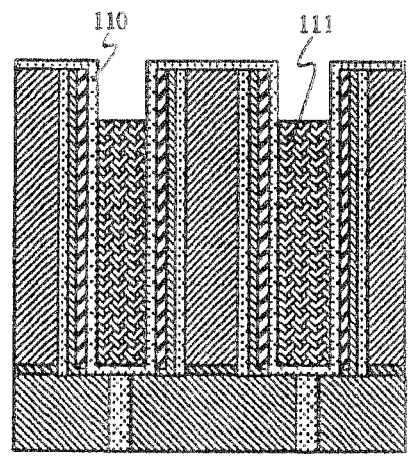
Figure 2D:
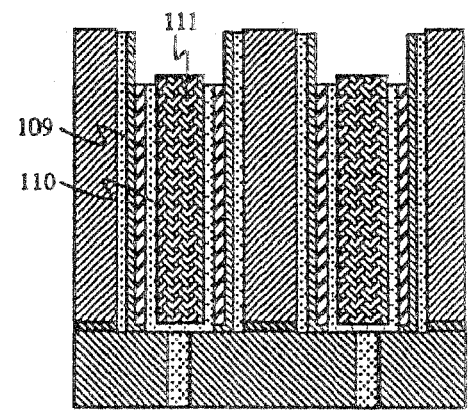
Figure 2E:
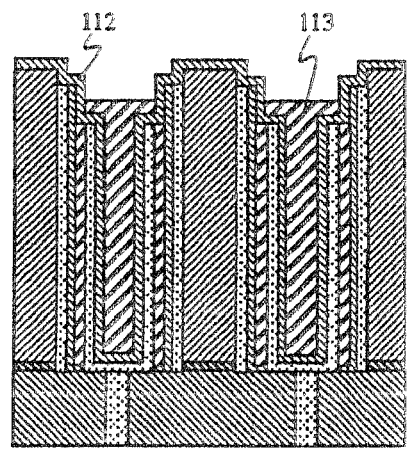
Figure 2F:
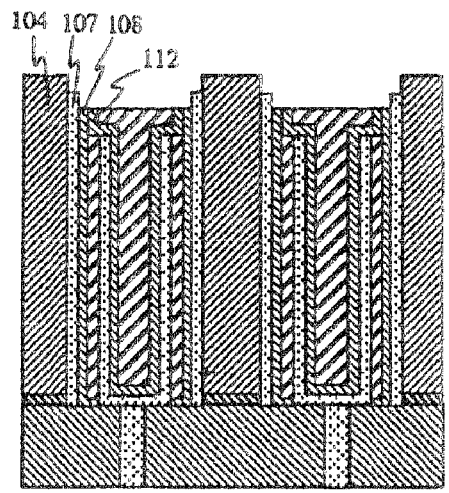
Figure 2G:
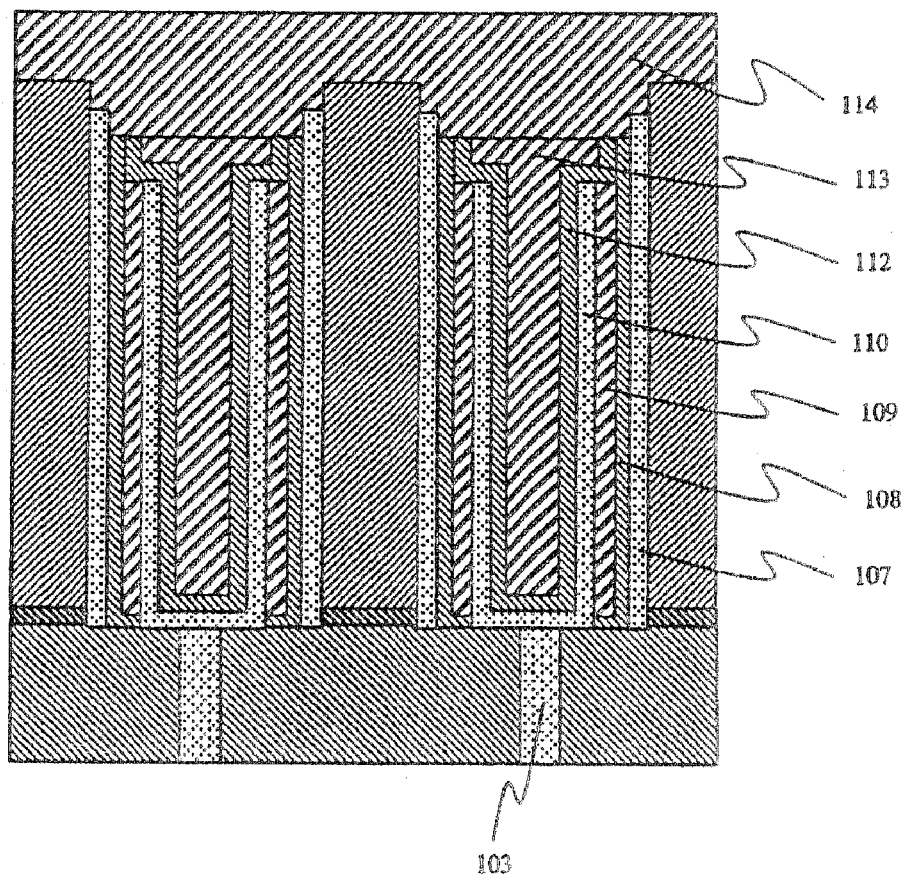
Figure 3A:
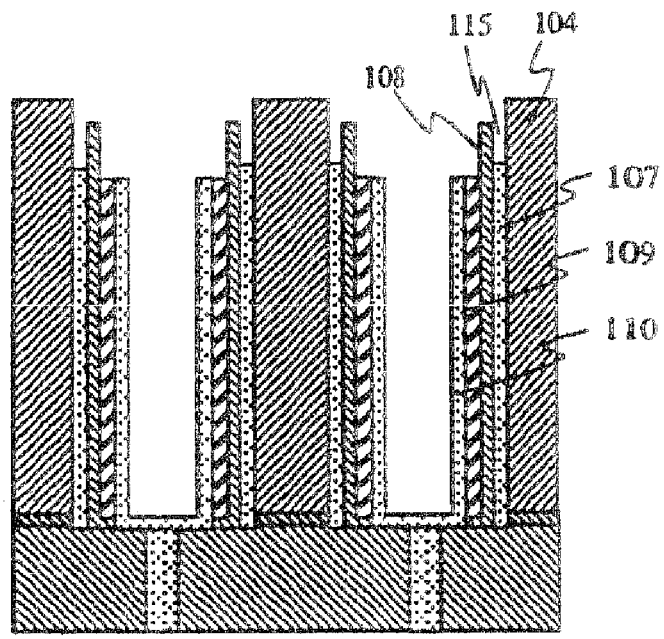
FIGS. 3A to 3D are cross-sectional views of a series of steps to explain a problem in Example described in Japanese Patent Application Laid-Open No. 10-173148.
Figure 3B:
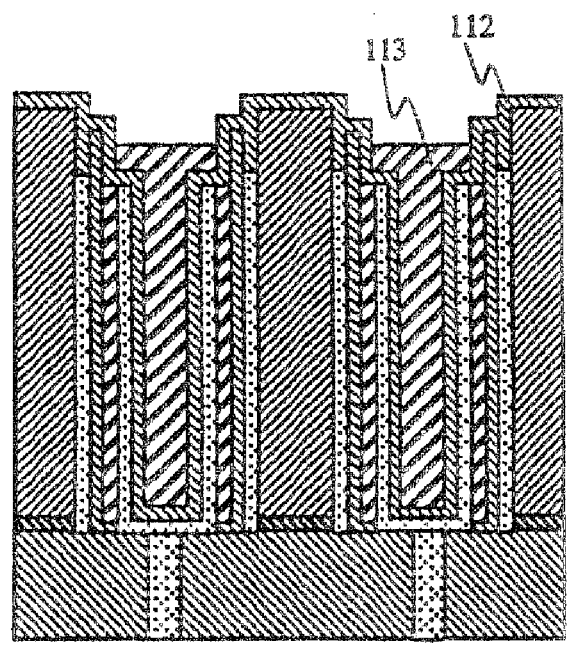
Figure 3C:
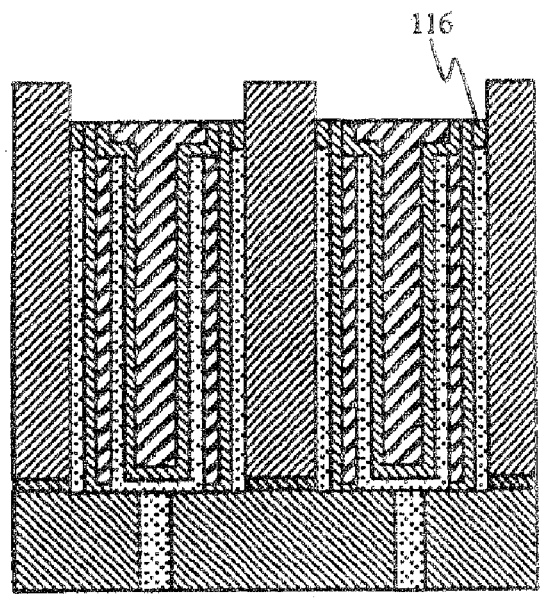
Figure 3D:
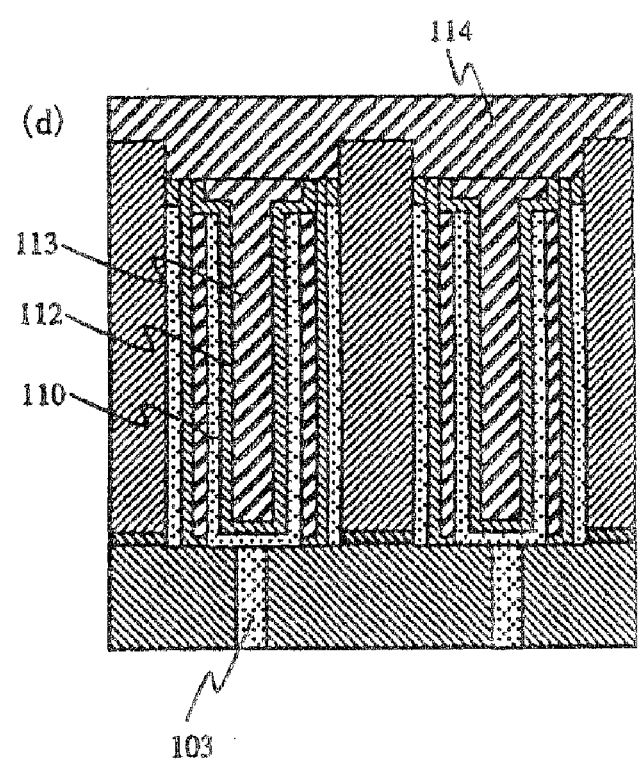
Figure 4A:
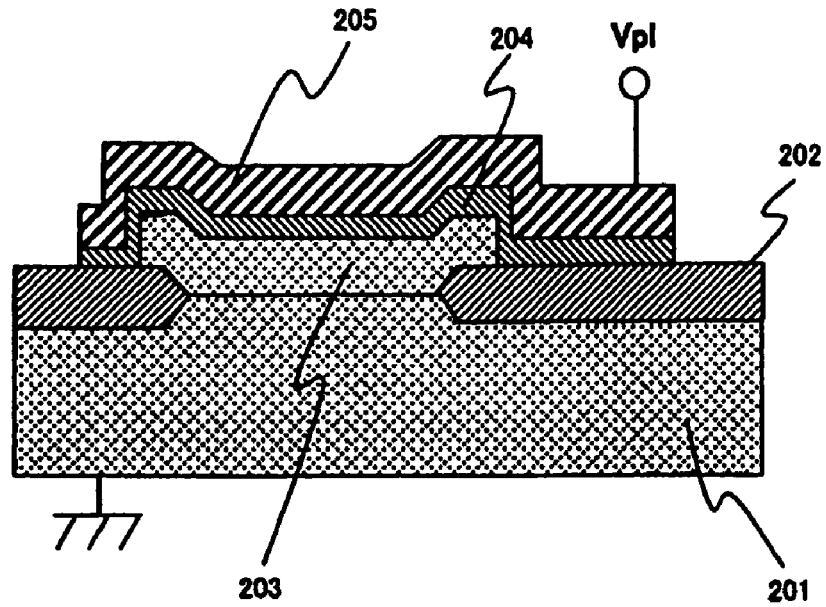
FIGS. 4A and 4B are cross-sectional views of samples used for evaluation to explain Example 1 of the present invention.
Figure 4B:
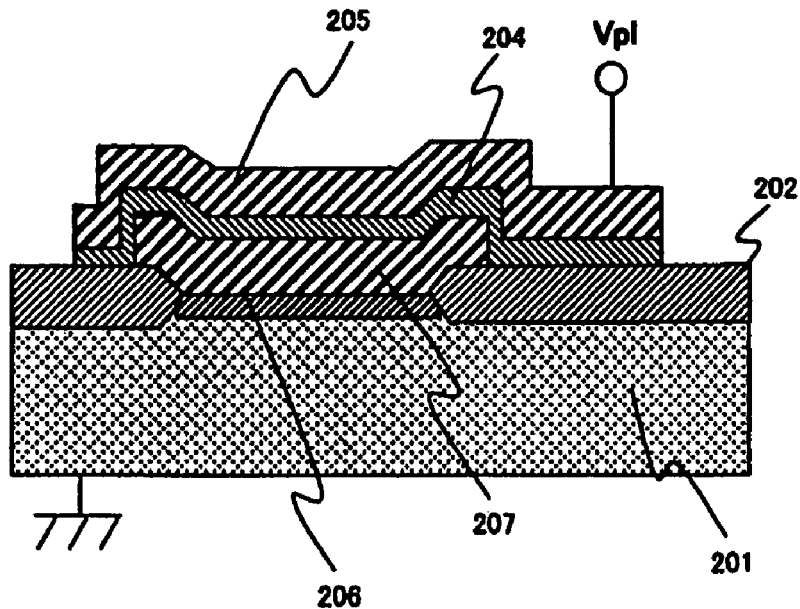

FIGS. 4A and 4B are cross-sectional views showing the structures of the samples used for the evaluation of the insulating property of tantalum oxide. FIG. 4A is that for the case where a lower electrode is made of polycrystalline silicon (sample A), and FIG. 4B is that for the case where a lower electrode is made of titanium nitride (sample B).

First, the structure of the sample A will be explained with reference to FIG. 4A. An element isolation region 202 was formed on the surface of an n-type silicon substrate 201 by a well-known selective oxidation process (LOCOS: Local Oxidation of Silicon). Then, the native oxide layer on the surface of the exposed silicon substrate was removed. After that, a polycrystalline silicon film containing $3 \times 10^{20}$ cm$^{-3}$ of phosphorus was deposited by CVD (Chemical Vapor Deposition) method in which monosilane ($SiH_4$) and phosphine ($PH_3$) were used as raw material gases. The polycrystalline silicon film was treated by known lithography and dry etching to form a prescribed pattern as a capacitor lower electrode 203.

Then, the surface of the lower electrode 203 was subjected to cleaning treatment in a solution containing hydrofluoric acid (HF) and heat treated for 1 minute in an atmosphere of ammonia ($NH_3$) at 750° C. to form a silicon nitride film with the thickness of 1 nm (not shown in the figure) on the surface of the lower electrode 203.

Then, a tantalum oxide film 204, which was to be a dielectric of the capacitor, was deposited through the following procedures. CVD method was used in which pentaethoxytantalum (PET/Ta($OC_2H_5$)$_5$) as a raw material and oxygen ($O_2$) as an oxidizing agent were employed. The conditions of CVD were 430° C. for the temperature and 0.5 Torr for the pressure.

First, the tantalum oxide film was deposited to the thickness of 4 nm, and after that the tantalum oxide film was heat treated in an atmosphere of ozone-containing oxygen at 550° C. for 1 minute and further heat treated in an atmosphere of nitrogen at 750° C. for 2 minutes to crystallize the tantalum oxide.

The tantalum oxide film immediately after deposited under the above conditions was in the amorphous state and its specific dielectric constant was about 25. However, the crystallization increased the specific dielectric constant of the tantalum oxide to 50. And the heat treatment allowed a silicon oxynitride film with the thickness of several nm to be formed in the interface of the lower electrode 203, which is made of polycrystalline silicon, and the tantalum oxide film 204.

Then, on the crystallized tantalum film with the thickness of 4 nm, a tantalum oxide film was further deposited to the thickness of 8 nm so that they were stacked under the same conditions as above. Tantalum oxide has the property of undergoing epitaxial growth when deposited on a crystallized tantalum oxide film, and the above tantalum oxide film with the thickness of 8 nm had been completely crystallized right after its deposition. Accordingly, heat treatment for crystallization of stacked tantalum oxide was not fundamentally necessary. However, in this Example, heat treatment was performed in an atmosphere of nitrogen at 650° C. for 1 minute, for comparison with the sample B.

Then, a titanium nitride film, which was to be an upper electrode 205, was deposited. CVD method was used in which titanium chloride ($TiCl_4$) as a raw material and ammonia (NH₃) as a nitriding agent were employed. The conditions of CVD were 550° C. for the temperature and 1 Torr for the pressure. The film thickness of the titanium nitride film was 40 nm. The titanium nitride film was treated by lithography and dry etching to form a prescribed pattern as an upper electrode 205.

Measurement was made while applying bias voltage Vpl between the silicon substrate 201 and the upper electrode 205.

In the following, the sample B whose lower electrode is made of titanium nitride will be explained with reference to FIG. 4B. In the same manner as FIG. 4A, after an element isolation region 202 was formed, a titanium silicide film 206 and a titanium nitride film which was to be a lower electrode 207 were formed successively on the exposed surface of a silicon substrate 201.

The titanium silicide film was formed by forming plasma of titanium chloride at 550° C. and depositing titanium atom on the surface of the substrate while allowing silicide formation to progress. The thickness of the titanium silicide film was 10 nm.

After that, plasma formation was stopped and ammonia was fed while feeding titanium chloride, to deposit titanium nitride. The titanium nitride film was treated by lithography and dry etching to form a prescribed pattern as a lower electrode 207. Then, a tantalum oxide film 204, as a dielectric, and an upper electrode 205 were formed in the same manner as the case of FIG. 4A, to prepare a capacitor. In this structure, since the lower electrode was made of titanium nitride, a silicon oxynitride film was not formed in the interface of the tantalum oxide film and the lower electrode.

Figure 5:
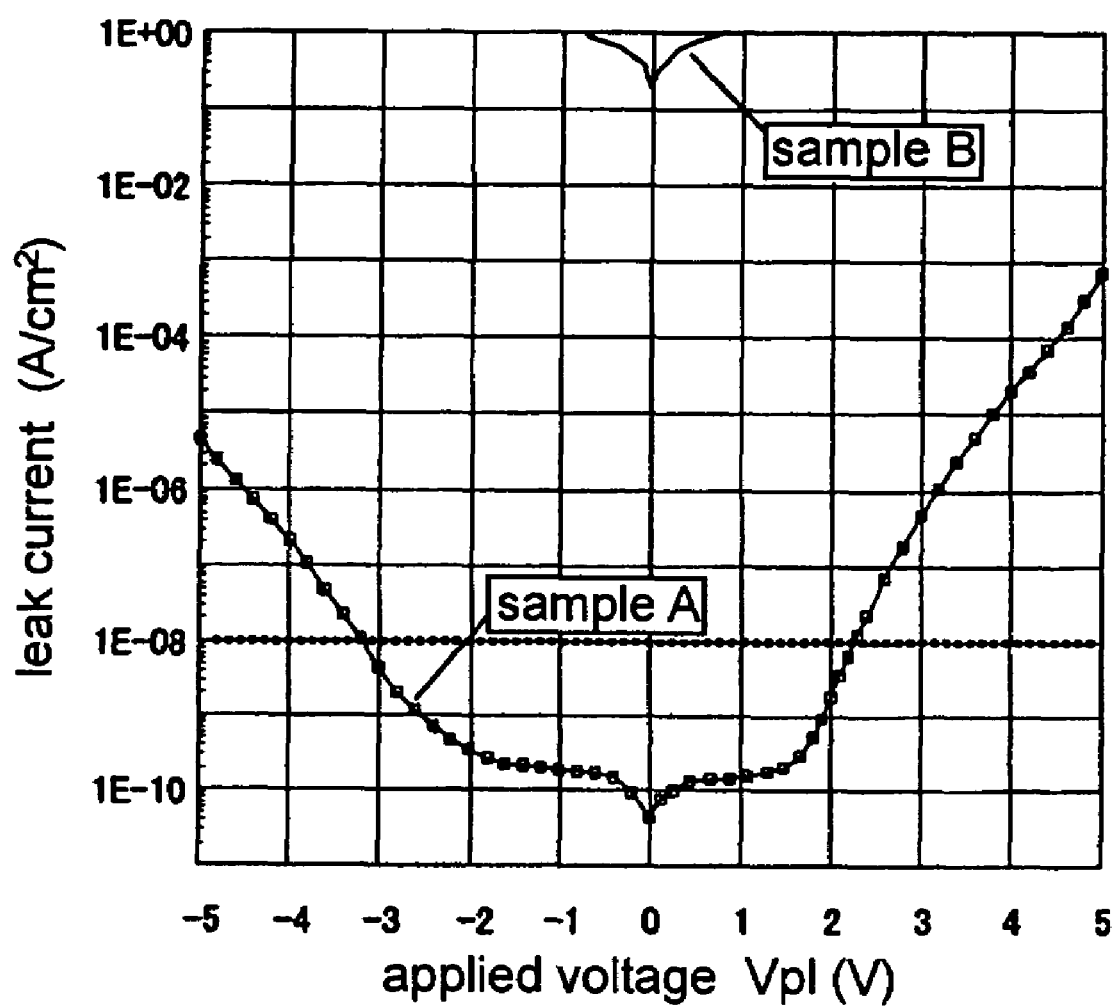
FIG. 5 is the evaluation results (current-voltage characteristics) to explain Example 1 of the present invention.

FIG. 5 shows the current-voltage characteristics of the capacitors having the structure of each of the sample A and the sample B. The figure plots a voltage Vpl applied to the upper electrode as the abscissa and a leak current per unit area as the ordinate.

In capacitors having a three-dimensional structure which are applied to gigabit-class DRAMs, allowable leak current values are required to be $1 \times 10^{-9}$ (A/cm²) or lower at ±1.0 V. The characteristic indicated by "sample A" in the figure is that of the capacitor whose lower electrode is made of polycrystalline silicon, while the characteristic indicated by "sample B" is that of the capacitor whose lower electrode is made of titanium nitride.

As is apparent from FIG. 5, in the sample A whose lower electrode is made of polycrystalline silicon, the leak current values were as small as about $2 \times 10^{-10}$ (A/cm²) at both +1.0 V and −1.0 V. This indicates that satisfactory insulating property can be obtained. Further, the sample A was not broken, but stable when applying a voltage of ±5.0 V. On the other hand, in the sample B whose lower electrode is made of titanium nitride, even at a low voltage of ±1.0 V, the leak current was observed whose values were much larger than those in the range of ordinary current evaluation, and thus, its insulating property was not observed. This indicates that the tantalum oxide film on the titanium nitride film was in the completely conducting state.

The reason that the sample B was made conductive is that oxygen atoms that constitute tantalum oxide are absorbed by the titanium in the titanium nitride film. Specifically, the number of oxygen-vacancy defects is increased in the tantalum oxide film, and current flows through the defects. Particularly the tantalum oxide film in the amorphous state shows a significant tendency toward this phenomenon. This phenomenon becomes significant when the deposited tantalum oxide film undergoes heat treatment at about 650° C., though the phenomenon has already occurred in the tantalum oxide deposition step at about 400° C., and the tantalum oxide film is brought to the almost completely conducting state. The same phenomenon occurs when the lower electrode is made up of titanium instead of titanium nitride.

The same phenomenon is also observed when the lower electrode is made of silicon. However, in the case of silicon, oxygen atoms absorbed from tantalum oxide react with the silicon to form a silicon oxide film in the interface of the tantalum oxide film and the lower electrode. The formed silicon oxide film retards the absorption of oxygen atoms from the tantalum oxide, whereby the reaction is saturated. In the case of titanium nitride, this saturation phenomenon is not observed. Further, in the case of the silicon lower electrode, the electrode already has a silicon nitride film formed on its surface and the silicon nitride film functions as a barrier to oxygen diffusion; as a result, the effect of retarding oxygen atom absorption is enhanced. And the silicon oxide film formed in the interface functions as an obstacle to leak current generation, and thus, it is rather effective in reduction of leak current.

Although the tantalum oxide film formed by CVD method has been described in this Example, the same results are obtained for a tantalum oxide film formed by ALD (Atomic Layer Deposition) method. The tantalum oxide film formed by ALD method is also in the amorphous state right after formation. If the tantalum oxide film undergoes heat treatment at about 650° C., irrespective of atmosphere, the tantalum oxide film on titanium nitride film can be brought to the conducting state due to the above described oxygen absorption phenomenon.

EXAMPLE 2

Figure 6:
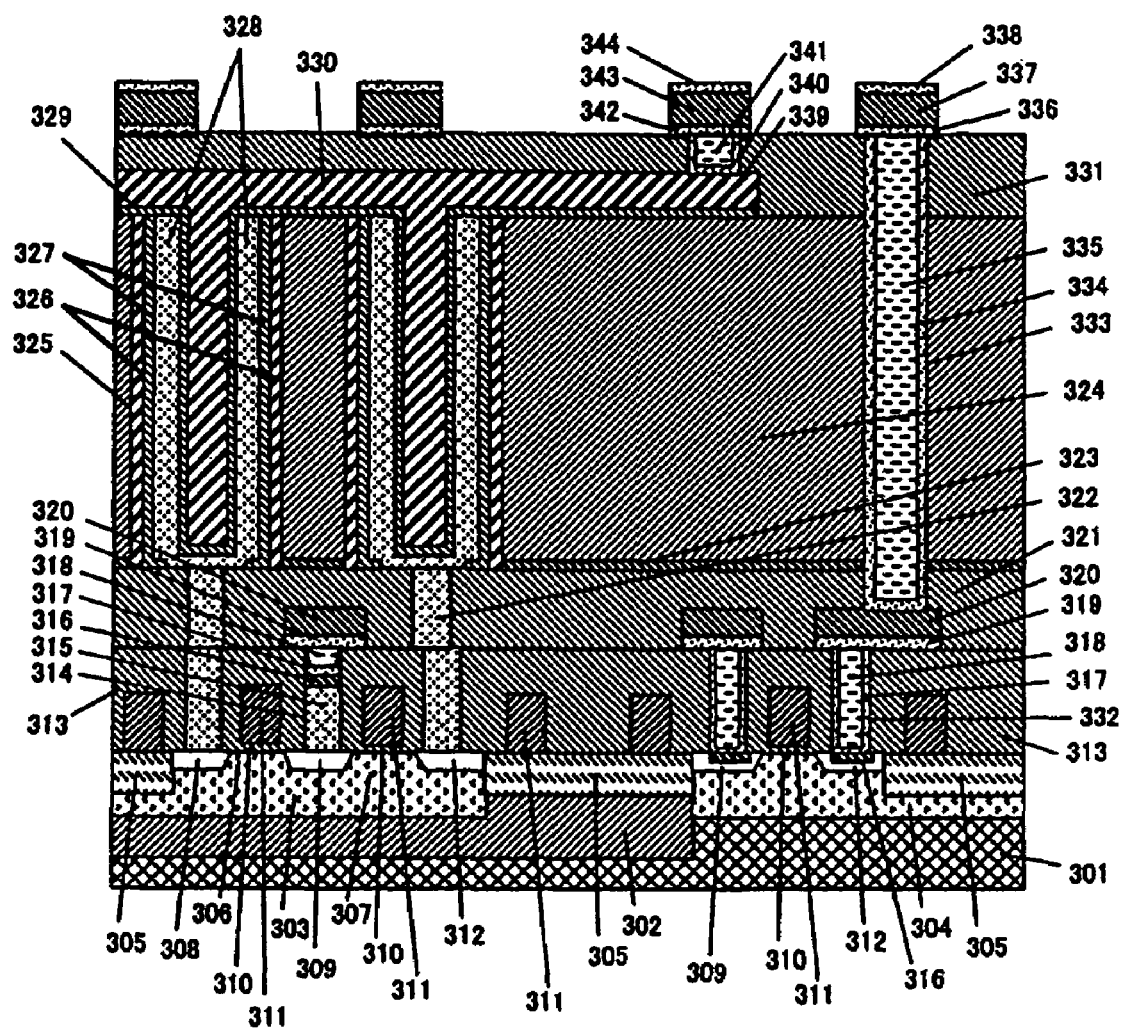
FIG. 6 is a cross-sectional view of a DRAM to explain Example 2 of the present invention.

In Example 2, one example of DRAM organizations having a crown-structure capacitor will be explained with reference to FIG. 6. FIG. 6 is a schematic cross-sectional view of a DRAM having a first aluminum interconnect layer formed therein.

In a p-type silicon substrate 301 was formed an n-well 302 and in the inside of the n-well 302 was formed a first p-well 303. In the region other than the n-well 302 was formed a second p-well 304 so that an element isolation region 305 was formed. For the convenience's sake, the first p-well 303 shows a memory array region where a plurality of memory cells are arranged and the second p-well 304 shows a peripheral circuit region.

In the first p-well 303 were provided switching transistors 306 and 307, which were constituents of the respective memory cells and were to be a word line. The transistor 306 was made up of a drain 308, a source 309 and a gate electrode 311 via a gate insulator 310. The transistor 307 was made up of the source 309, which is common to each transistor, a drain 312 and a gate electrode 311 via a gate insulator 310. An insulating film 313 having flat surface was provided in such a manner as to cover each transistor.

A silicon plug 315 made of polycrystalline silicon was provided in a contact hole 314 formed in a specified region of the insulating film 313 in such a manner as to be connected to the source 309. On the surface of the silicon plug 315, a bit line contact consisting of a titanium silicide film 316, a titanium nitride film 317 and a tungsten film 318 was provided and a bit line consisting of a tungsten nitride film 319 and a tungsten film 320 was provided in such a manner as to be connected to the bit line contact. A first inter layer dielectric 321 having flat surface was provided in such a manner as to cover the bit line.

A silicon plug 322 was provided in a contact hole formed in a specified region of each of the insulating film 313 and the first inter layer dielectric 321 in such a manner as to be connected to each of the drain 308 and 312 of the transistor.

On the silicon plug 322 was formed a crown-structure capacitor. A trench (deep hole) 325 was formed in a specified region of each of a silicon nitride film 323 on the first inter layer dielectric 321 and a second inter layer dielectric 324. On the side face of the trench 325 was formed a first upper electrode 326 made of titanium nitride and on the side face of the first upper electrode 326 was provided a first dielectric 327. A lower electrode 328 made of polycrystalline silicon was formed on the inside face and the bottom surface of the first dielectric 327, to be connected to the silicon plug 322.

A second dielectric 329 made of tantalum oxide was formed on the whole surface including the surface of the lower electrode 328 and a second upper electrode 330 was formed on the whole surface of the second dielectric 329. A third inter layer dielectric 331 was formed in such a manner as to cover the capacitor.

On the other hand, in the second p-well 304 was provided a transistor constituting a peripheral circuit, which was made up of a source 309, a drain 312, a gate insulator 310 and a gate electrode 311. In a specified region of the insulating film 313, a contact hole 332 was formed in such a manner as to be connected to the drain 312. A contact plug consisting of a titanium silicide film 316, a titanium nitride film 317 and a tungsten film 318 was provided, and on the contact plug was formed a first interconnect layer consisting of a tungsten nitride film 319 and a tungsten film 320. A part of the first interconnect layer was connected to a second interconnect layer consisting of a titanium nitride film 336, an aluminum film 337 and a titanium nitride film 338 via a titanium nitride film 334 and a tungsten film 335, which were filled into a contact hole 333 formed in such a manner as to pass through a first inter layer dielectric 321, a silicon nitride film 323, a second inter layer dielectric 324 and a third inter layer dielectric 331.

An upper electrode 330 of the capacitor, which was provided in the memory array region, in part of the region was led out as a lead interconnect 339 into the peripheral circuit region. And, it was connected to a second interconnect layer consisting of a titanium nitride film 342, an aluminum film 343 and a titanium nitride film 344 via a titanium nitride film 340 and a tungsten film 341, which were filled into the contact hole formed in the specified region of the third inter layer dielectric 331. Then, formations of an inter layer dielectric, a contact and an interconnect layer was repeated depending on its needs to make up a DRAM.

According to this Example, a capacitor can be provided which includes a crown-structure lower electrode having an outside face and an inside face with the second inter layer dielectric forming the trench being left, in which a first capacitor region having a first dielectric and a first upper electrode made of titanium nitride is provided on the outside face of the crown-structure lower electrode, and a second capacitor region having a second dielectric made of tantalum oxide and a second upper electrode is provided on the inside face of the crown-structure lower electrode. The first upper electrode made of titanium nitride can be electrically connected to the second upper electrode, though it is in such a position that it is out of contact with the second upper electrode due to the intervention of the second dielectric made of tantalum oxide, because the tantalum oxide film in contact with the titanium nitride film is in the conducting state.

EXAMPLE 3

Then Example 3 of the present invention will be explained. FIGS. 7A to 7L are cross-sectional views of a series of steps in the crown-structure capacitor manufacturing process of the present invention. FIG. 7M is an enlarged view of FIG. 7K.

Figure 7A:
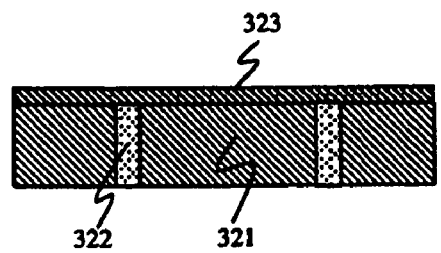
FIGS. 7A to 7L are cross-sectional views of a series of steps to explain Example 3 of the present invention.

First, as shown in FIG. 7A, a silicon plug 322 was formed in a specified region of a first inter layer dielectric 321 by a well-known process and then a silicon nitride film 323 with the thickness of 50 nm was formed on the surface, by a well-known process, LPCVD (Low Pressure Chemical Vapor Deposition) method.

Figure 7B:
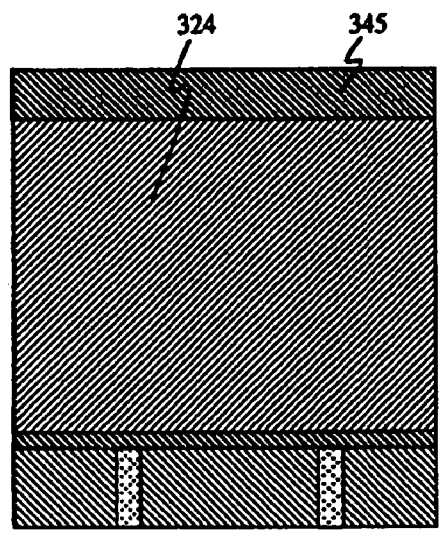

Then, as shown in FIG. 7B, a silicon oxide film 324 with the thickness of 2000 nm was formed by a well-known process, plasma CVD method, and a silicon film 345 with the thickness of 500 nm was formed so as to be stacked on the silicon oxide film 324 by a well-known process, CVD method. The silicon film 345 was used as a hard mask when the subjecting silicon oxide film 324 to dry etching. After this, a photoresist pattern was formed on the silicon film 345 by lithography, though it is not shown in the figure. Then, the silicon film 345 was etched by a well-known process, plasma dry etching, using the photoresist pattern as a mask to transfer the pattern to the silicon film 345. The dry etching of the silicon film was performed using a mixed gas of chlorine ($Cl_2$), hydrogen bromide (HBr) and oxygen ($O_2$) where the pressure was 10 mTorr and the plasma power was 100 W. The conditions may be changed properly as long as the silicon film can be etched.

Figure 7C:
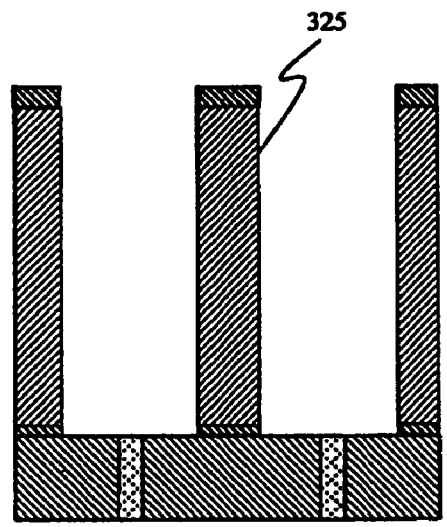

Then, as shown in FIG. 7C, the silicon oxide film 324 with the thickness of 2000 nm was etched by dry etching using the silicon film 345, which had the pattern transferred, as a mask, to form a trench 325. The dry etching of the silicon oxide film was performed using a mixed gas of octafluorocyclopentane ($C_5F_8$), argon (Ar) and oxygen ($O_2$) where the pressure is 100 mTorr and the plasma power is 1500 W.

After that, the silicon film 345, which was used as a hard mask, was removed by isotropic dry etching. In this removing operation, when the silicon film 345 is left thick, the silicon plug 322 exposed to the inside of the trench might be unintentionally etched. To avoid this, it is possible, in the trench formation operation, to remove the silicon film 345 remaining at the stage where the silicon nitride film 323 is exposed, and then etching the silicon nitride film. Employing CMP (Chemical Mechanical Polishing) method also makes it possible to selectively remove the silicon film 345 on the surface while avoiding etching of the silicon plug.

Figure 7D:
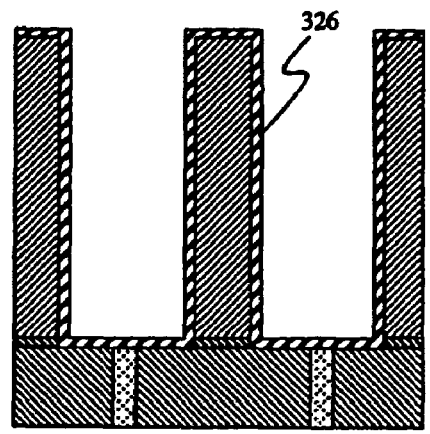

Then, as shown in FIG. 7D, a titanium nitride film with the thickness of 15 nm, which was to be a first upper electrode 326, was formed by CVD method. The CVD method was performed using titanium chloride ($TiCl_4$) as a raw material and ammonia ($NH_3$) as a nitriding agent where the pressure is 1 Torr and the temperature is 550° C.

Figure 7E:
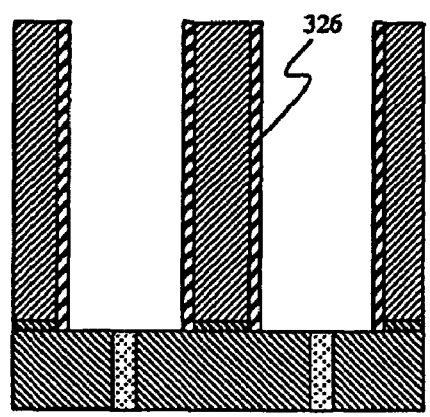

Then, as shown in FIG. 7E, the titanium nitride film formed on the surface other than the surface of the trench and on the trench bottom was removed by dry etching to form the first upper electrode 326 on the side wall of the trench. The dry etching of the titanium nitride film was performed using a mixed gas of chlorine ($Cl_2$) and boron chloride ($BCl_3$) where the pressure is 10 mTorr and the plasma power is 100 W. In this etching operation, the silicon plug 322 might be unintentionally etched, however, it is substantially no problem because the film thickness of the titanium nitride film is small.

Figure 7F:
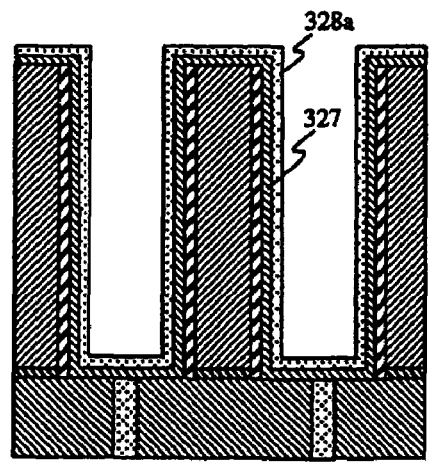

Then, as shown in FIG. 7F, an aluminum oxide film with the thickness of 6 nm, which was to be a first dielectric 327, and a phosphorus-doped silicon film with the thickness of 15 nm, which was to be a lower electrode 328a positioned on the outside of the aluminum oxide, were formed in such a manner as to be stacked.

The aluminum oxide film was formed by atomic layer deposition (ALD: Atomic Layer Deposition) method using trimethylaluminum (TMA: $Al(CH_3)_3$) as a raw material gas and ozone ($O_3$) as an oxidizing agent. The basic steps which consist of raw material feeding, exhaust, ozone feeding and exhaust were taken as a cycle and the cycle was repeated 60 times to form the aluminum oxide with the thickness of 6 nm. The raw material and ozone were fed while keeping the pressure at 0.5 Torr and the temperature at 350° C. Since the efficiency of deposition by ALD method is very low, it is preferable to employ batch treatment, in which a plurality of substrates can be treated simultaneously. The conditions of ALD method can be changed variously.

On the other hand, the phosphorus-doped silicon film was formed by CVD method. The silicon film containing $3 \times 10^{20}$ $cm^{-3}$ of phosphorus was deposited using monosilane ($SiH_4$) and phosphine ($PH_3$) as raw material gases where the pressure was 1 Torr and the temperature was 520° C. The silicon film deposited under the above conditions is amorphous and has the advantage of having very smooth surface.

Figure 7G:
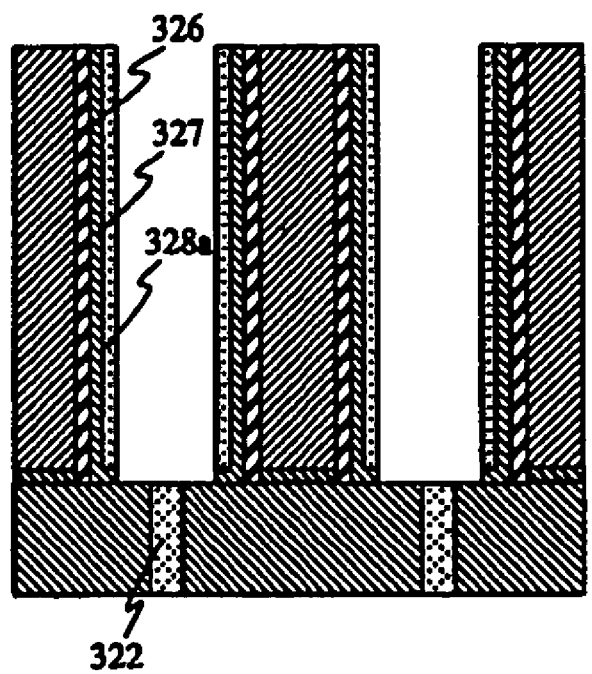

Then, as shown in FIG. 7G, the silicon film and the aluminum oxide film formed on the surface other than the surface of the trench and on the trench bottom were removed by dry etching to form the first dielectric 327, which was in contact with the first upper electrode 326, and the outside lower electrode 328a. At the same time, the surface of the silicon plug 322 was exposed. This dry etching can be performed under the same conditions as those employed for dry etching of silicon film used as a hard mask.

Figure 7H:
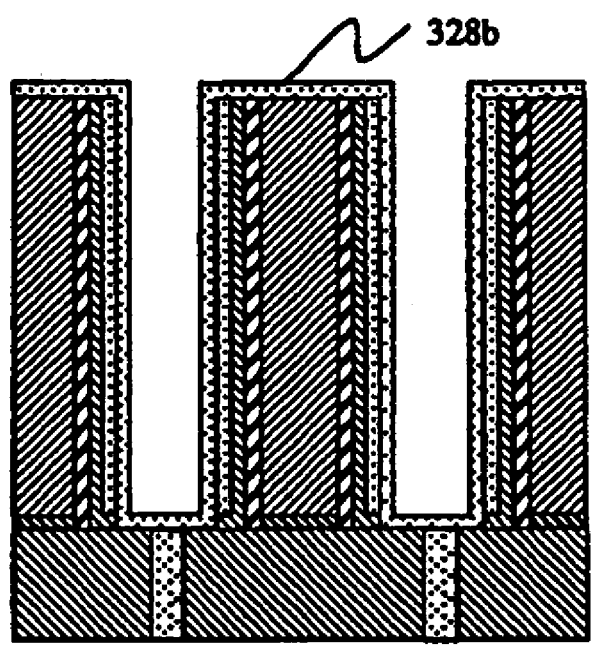
Figure 7I:
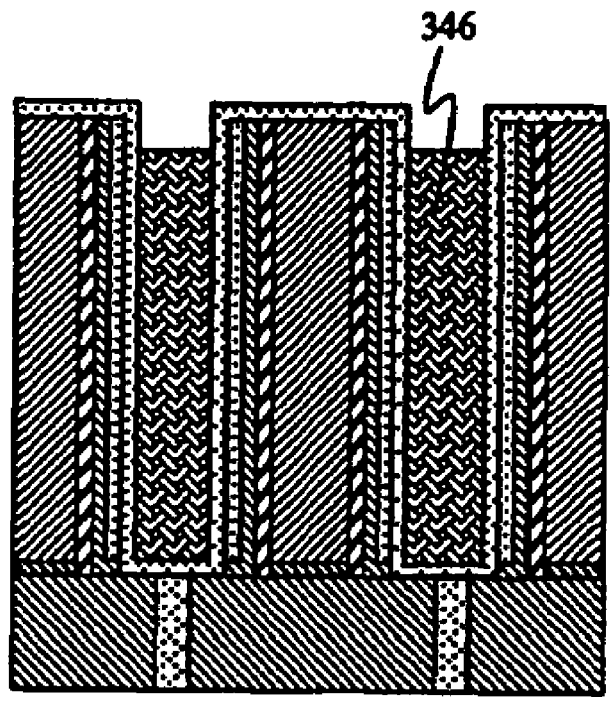

Then, as shown in FIG. 7H, a phosphorus-doped silicon film with the thickness of 15 nm, which was to be an inside lower electrode 328b, was deposited on the whole surface. The deposition conditions were the same as those employed for the formation of the outside lower electrode 328a. Before the deposition, a treatment was done for removing the native oxide film formed on the surface of the silicon plug 322 and the outside lower electrode 328a;

Then, as shown in FIG. 7I, a photoresist 346 was formed on the whole surface by spin coating and then subjected to exposure and development to allow the photoresist 346 to remain in the inside of the trench alone.

Figure 7J:
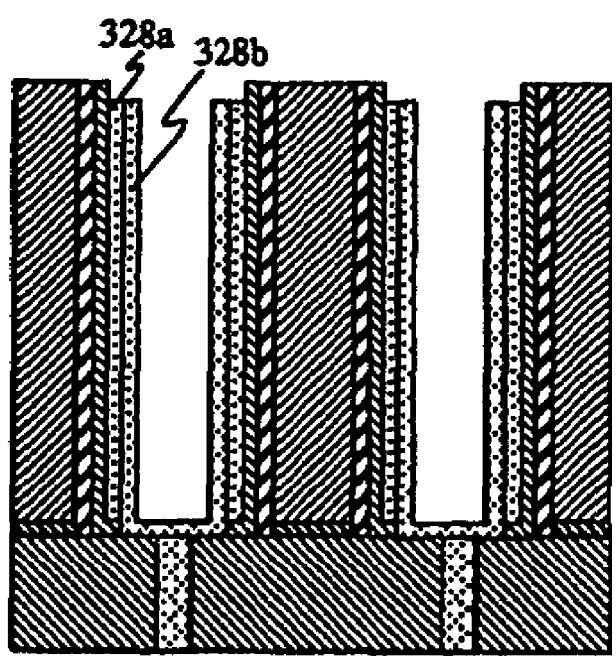

Then, as shown in FIG. 7J, the silicon film exposed on the surface was removed by dry etching. Subsequently after that, the photoresist was removed by oxygen ashing. At this stage, a lower electrode made up of the inside lower electrode 328b, which was connected to the silicon plug 322, and the outside lower electrode 328a, which was connected to the inside lower electrode, had been formed. A first capacitor region made up of the outside lower electrode 328a, the first dielectric 327 and the first upper electrode 326 had been also formed.

Figure 7K:
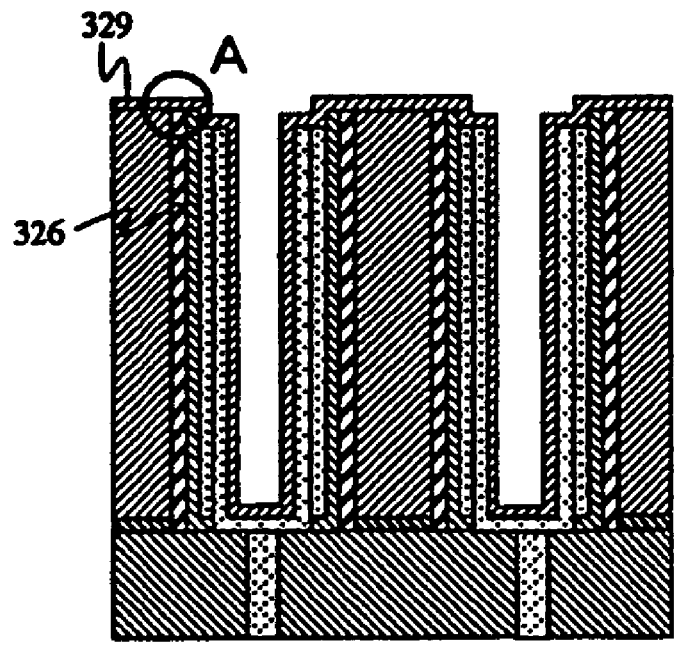

Then, as shown in FIG. 7K, a tantalum oxide film, which was to be a second dielectric 329, was deposited by CVD method under the same conditions as those employed in Example 1. First, the tantalum oxide film with the thickness of 4 nm was deposited, and the tantalum oxide film was heat treated in an atmosphere of ozone-containing oxygen at 550° C. for 1 minute and further heat treated in an atmosphere of nitrogen at 750° C. for 2 minutes to be crystallized.

Then, on the crystallized tantalum oxide film with the thickness of 4 nm, a tantalum oxide film with the thickness of 8 nm was deposited so that they were stacked under the same conditions. After that, the tantalum oxide film was heat treated in an atmosphere of nitrogen at 650° C. for 1 minute.

These heat treatment operations made the tantalum oxide film 329, shown by circle A in the figure, which was in contact with the first upper electrode made of titanium nitride, to the completely conducting state. FIG. 7M is an enlarged view of FIG. 7K. The portion of the second dielectric 329 made of tantalum oxide, which is in contact with the upper end of the first upper electrode 326 made of titanium nitride became a conducting tantalum oxide film 328a.

The lower electrode (328a and 328b) made of phosphorus-doped amorphous silicon can be polycrystallized by the above heat treatment, to be changed to a conductor. The lower electrode may be polycrystallized before the formation of the tantalum oxide film.

Figure 7L:
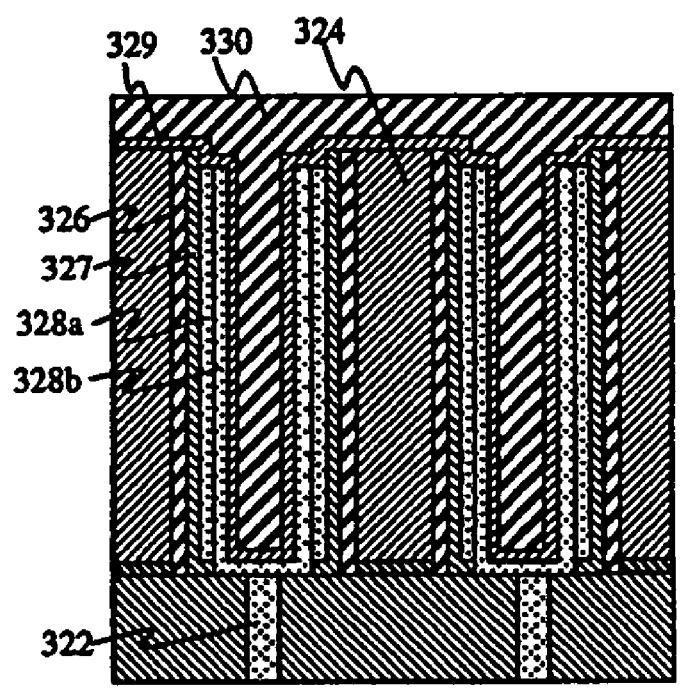
Figure 7M:
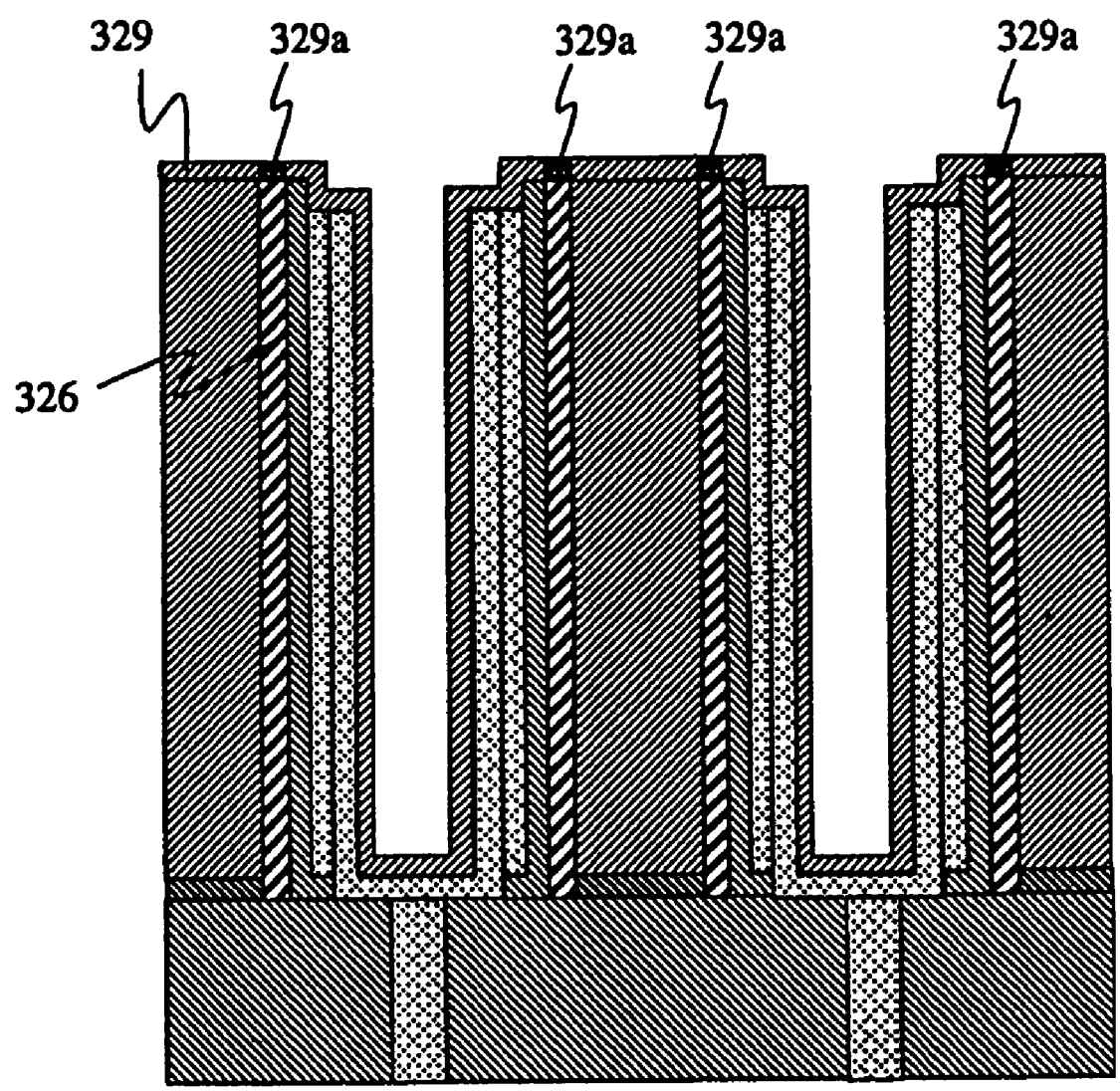
FIG. 7M is an enlarged cross-sectional view of FIG. 7K.

Then, as shown in FIG. 7L, a titanium nitride film, which was to be a second upper electrode 330, was deposited. CVD method using titanium chloride ($TiCl_4$) as a raw material and ammonia ($NH_3$) as a nitriding agent was applied. The CVD method was performed at the temperature of 550° C. and at the pressure of 1 Torr. The upper electrode may be formed by stacking another metal film, such as a tungsten film, on the titanium nitride film.

At this stage, in the trench formed in the second inter layer dielectric 324, a crown-structure capacitor could be formed which includes: a first capacitor region made up of the outside lower electrode 328a, the first dielectric 327 and the first upper electrode 326; and a second capacitor region made up of the inside lower electrode 328b, the second dielectric 329 and the second upper electrode 330.

According to this Example, the first upper electrode and the second upper electrode are electrically connected with each other by utilizing the property of tantalum oxide which is brought to the conducting state when it is on the titanium nitride film, whereby an advantage can be obtained that a crown-structure capacitor can be manufactured easily and simply without employing complicated dry etching processes, which are described in the known prior application.

In this Example, the tantalum oxide film was formed after the formations of the first upper electrode, the first dielectric and the lower electrode, and underwent heat treatment at 750° C. to be crystallized. In such a case, since the first upper electrode is formed at 550° C. and the first dielectric at 350° C., when applying heat treatment at 750° C., warping of the first dielectric might result due to the difference in degree of denseness, causing increase of the leak current. To avoid this, it is effective to perform heat treatment in an atmosphere of ammonia or nitrogen at 750° C. for 1 minute after the formation of the first upper electrode and to perform heat treatment in an atmosphere of nitrogen at 700° C. for 1 minute after the formation of the first dielectric. In other words, it is effective to perform heat treatment whenever each film is formed, thereby making the film dense.

In this Example, though silicon was used for the lower electrode, a metal, such as tungsten or ruthenium, or a metal compound such as tungsten nitride may also be used. In this case, since the lower electrode is conductive when it is formed, heat treatment for crystallization is not required. Further, an amorphous silicon film with the thickness of 10 nm or smaller can sometimes be difficult to crystallize, but the use of a metal or the like has the advantage of eliminating such a problem. The use of tungsten, tungsten nitride or ruthenium for the lower electrode also produces the effect of retarding leak current, because it prevents the absorption of oxygen from tantalum oxide as described in Example 1.

In this Example, though CVD method was used except when the aluminum oxide film as the first dielectric was formed by ALD method, ALD method can also be used for forming the first upper electrode, the metal lower electrode or the tantalum oxide film. In this case, a thin film with the thickness of 10 nm or less can be formed with good controllability, giving the advantage of being applicable even when the width of the trench is decreased to accommodate increasing integration density of DRAMs.

In this Example, as shown in FIG. 7C, when forming a trench, the silicon nitride film 323 was also etched to expose the silicon plug 322. Thus, the silicon plug 322 was exposed to an etching atmosphere, though the degree was low, when removing the silicon film used as a hard mask, when dry etching the titanium nitride film which was to be the first upper electrode, or when etching the silicon film which was to be the outside lower electrode.

Figure 8A:
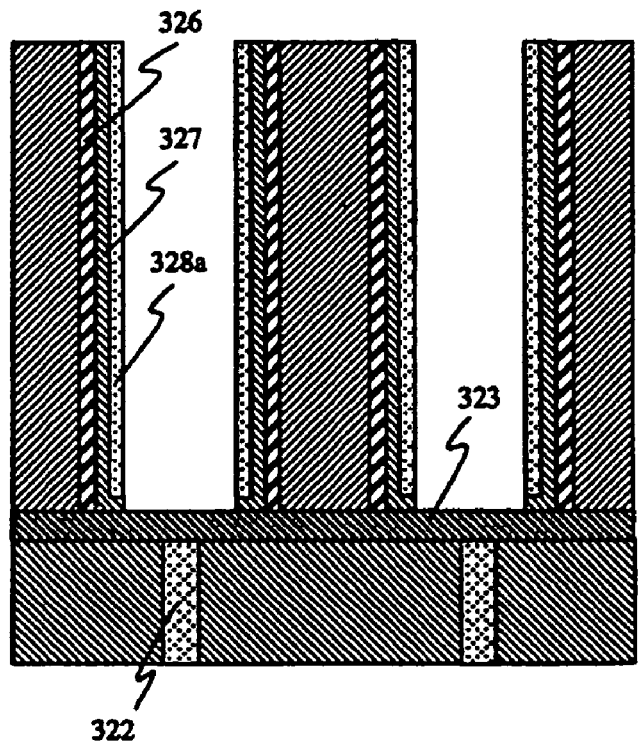
FIGS. 8A and 8B are cross-sectional views of a series of steps to supplementarily explain the application of Example 3 of the present invention.
Figure 8B:
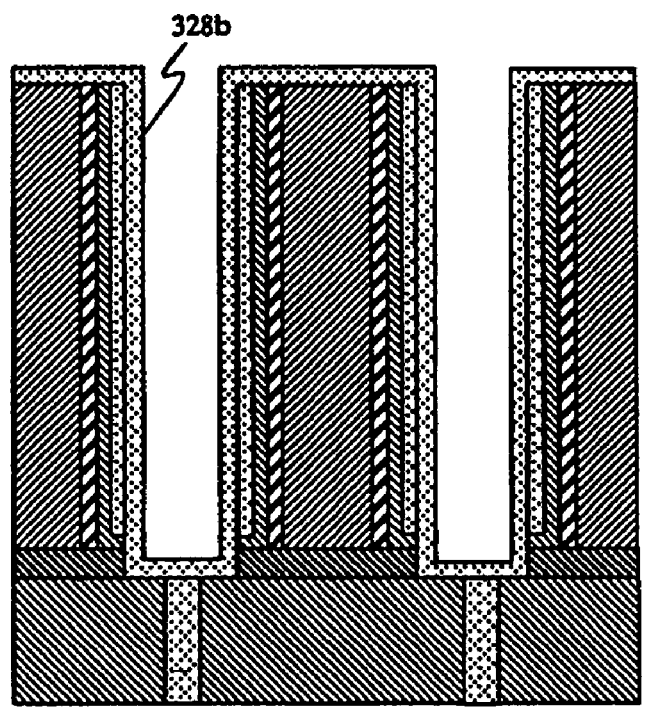

To avoid exposing the silicon plug 322 to such an etching atmosphere, it is effective to allow the silicon nitride film 323 to remain, as shown in FIGS. 8A and 8B. Specifically, the silicon nitride film 323 remains, until the first upper electrode 326, the first dielectric 327 and the outside lower electrode 328a are formed, to cover the surface of the silicon plug 322 (FIG. 8A). Then, the silicon nitride film 323 may be etched right before the formation of the inside lower electrode, to expose the silicon plug so that the inside lower electrode 328b is formed (FIG. 8B).

What is claimed is:

1. A capacitor, which comprises at least a lower electrode, a dielectric and an upper electrode:
    wherein the upper electrode comprises a first upper electrode and a second upper electrode;
    the first upper electrode has a portion where the first upper electrode is opposite to the second upper electrode via the dielectric; and
    the first upper electrode and the second upper electrode are electrically connected with each other via the dielectric which is in the conducting state at the portion where the first upper electrode is opposite to the second upper electrode.

2. The capacitor according to claim 1, which is formed in the inside of a trench formed in an insulating film and comprises the lower electrode, the dielectric and the upper electrode:
    wherein the lower electrode has a crown structure having an outside face and an inside face;
    the upper electrode comprises the first upper electrode which is opposite to the outside face of the lower electrode, and the dielectric and the second upper electrode which extend from the inside face of the lower electrode to the surface other than the surface of the trench; and
    the first upper electrode and the second upper electrode are electrically connected with each other via the dielectric which is in the conducting state at the portion where the first upper electrode is opposite to the second upper electrode.

3. The capacitor according to claim 1,
    wherein on the outside face of the lower electrode, a first capacitor region is provided which comprises a first dielectric formed in contact with the outside face of the lower electrode and a first upper electrode formed on the side face of the trench opposite to the lower electrode,
    on the inside face of the lower electrode, a second capacitor region is provided which comprises a second dielectric formed in contact with the inside face of the lower electrode and a second upper electrode formed in contact with the second dielectric,
    the second dielectric and the second upper electrode extend on the surface other than the surface of the trench, and
    the first upper electrode and the second upper electrode are electrically connected with each other via the second dielectric which is in the conducting state at the portion the first upper electrode is opposite to the second upper electrode.

4. The capacitor according to claim 1, wherein the first upper electrode is made of titanium or titanium nitride, and the dielectric is made of tantalum oxide.

5. The capacitor according to claim 3, wherein the second dielectric is made of tantalum oxide.

6. The capacitor according to claim 1, wherein the lower electrode is made of at least one material selected from the group consisting of polycrystalline silicon, metal silicide, tungsten and the compounds thereof, and ruthenium.

7. A process for manufacturing a capacitor which comprises a conductive plug connected to the surface of a semiconductor substrate and a lower electrode which is connected to the conductive plug, comprising at least:
    (1) a step of forming a trench in a specified position of an insulating film which is formed on the whole surface of the conductive plug and exposing the surface of the conductive plug;
    (2) a step of forming a first upper electrode on the side wall of the trench;
    (3) a step of forming a first dielectric on the side wall of the trench on which the first upper electrode has been formed;
    (4) a step of forming a lower electrode on the inside face of the trench on which the first dielectric has been formed and connecting the lower electrode with the conductive plug;
    (5) a step of forming a second dielectric so that it extends on the whole surface including the inside face of the trench on which the lower electrode has been formed; and
    (6) a step of forming a second upper electrode on the whole surface of the second dielectric including the inside face of the trench.

8. The process for manufacturing the capacitor according to claim 7, wherein the first upper electrode is electrically connected with the second upper electrode via the second dielectric which is in the conducting state at the portion where the second dielectric is in contact with the upper end of the first upper electrode.

9. The process for manufacturing the capacitor according to claim 7, wherein the first upper electrode is made of titanium or titanium nitride, the first dielectric comprises at least aluminum oxide formed by atomic layer deposition, and the second dielectric is made of tantalum oxide.

10. The process for manufacturing the capacitor according to claim 7, wherein the lower electrode is made of at least one material selected from the group consisting of polycrystalline silicon, metal silicide, tungsten and the compounds thereof, and ruthenium.

11. The process for manufacturing the capacitor according to claim 7, further comprising a step of heat treating in the temperature range of 600° C. to 750° C., after the formation of the second dielectric made of tantalum oxide.

* * * * *

UNITED STATES PATENT AND TRADEMARK OFFICE
CERTIFICATE OF CORRECTION

PATENT NO. : 7,667,257 B2 Page 1 of 1
APPLICATION NO. : 11/585203
DATED : February 23, 2010
INVENTOR(S) : Shinpei Iijima It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 591 days.

Signed and Sealed this

Twenty-eighth Day of December, 2010

David J. Kappos
*Director of the United States Patent and Trademark Office*